(12) United States Patent
Togawa et al.

(10) Patent No.: US 11,245,368 B2
(45) Date of Patent: Feb. 8, 2022

(54) CLASS D AMPLIFIER

(71) Applicant: Yamaha Corporation, Hamamatsu (JP)

(72) Inventors: Takeshi Togawa, Anjo (JP); Masao Noro, Hamamatsu (JP)

(73) Assignee: Yamaha Corporation, Hamamatsu (JP)

( * ) Notice: Subject to any disclaimer, the term of this patent is extended or adjusted under 35 U.S.C. 154(b) by 231 days.

(21) Appl. No.: 16/363,300

(22) Filed: Mar. 25, 2019

(65) Prior Publication Data
US 2019/0222182 A1    Jul. 18, 2019

Related U.S. Application Data

(63) Continuation of application No. PCT/JP2017/024802, filed on Jul. 6, 2017.

(30) Foreign Application Priority Data

Sep. 29, 2016    (JP) .............................. JP2016-192325

(51) Int. Cl.
*H03F 3/217*    (2006.01)
*H03F 3/185*    (2006.01)

(52) U.S. Cl.
CPC .......... *H03F 3/217* (2013.01); *H03F 3/2171* (2013.01); *H03F 3/2173* (2013.01); *H03F 2200/03* (2013.01); *H03F 2200/171* (2013.01); *H03F 2200/333* (2013.01); *H03F 2200/351* (2013.01)

(58) Field of Classification Search
CPC ...... H03F 3/217; H03F 3/2171; H03F 3/2173; H03F 2200/333; H03F 2200/351; H03F 2200/171; H03F 2200/03

USPC ........................................ 330/251, 10, 207 A
See application file for complete search history.

(56) References Cited

U.S. PATENT DOCUMENTS

| | | | | |
|---|---|---|---|---|
| 6,297,693 B1 * | 10/2001 | Pullen | ...................... | H03C 1/06 330/10 |
| 7,221,216 B2 * | 5/2007 | Nguyen | ..................... | H03F 1/32 330/10 |
| 8,022,756 B2 * | 9/2011 | Walker | ..................... | H03F 3/217 330/10 |

FOREIGN PATENT DOCUMENTS

JP    61-21007 B2    5/1986

OTHER PUBLICATIONS

International Search Report (PCT/ISA/210) issued in PCT Application No. PCT/JP2017/024802 dated Oct. 3, 2017 with English translation (five pages).
Japanese-language Written Opinion (PCT/ISA/237) issued in PCT Application No. PCT/JP2017/024802 dated Oct. 3, 2017 (four pages).

* cited by examiner

*Primary Examiner* — Hieu P Nguyen
(74) *Attorney, Agent, or Firm* — Crowell & Moring LLP

(57) ABSTRACT

A class D amplifier includes a self-oscillating class D amplification circuit that is driven by an output current signal; and a voltage-current converting circuit that outputs an output current signal in response to an input signal voltage and an output signal voltage from a feedback signal voltage.

3 Claims, 4 Drawing Sheets

CLASS D AMPLIFIER

CROSS REFERENCE TO RELATED APPLICATIONS

This application is a Continuation Application of PCT Application No. PCT/JP2017/024802, filed Jul. 6, 2017, and is based on and claims priority from Japanese Patent Application No. 2016-192325, filed Sep. 29, 2016, the entire contents of which are incorporated herein by reference.

BACKGROUND OF THE INVENTION

Field of the Invention

The present invention relates to self-oscillating class D amplifiers.

Description of Related Art

Self-oscillating class D amplifiers have been known as a type of amplifiers that power-amplifies audio signals or the like.

Japanese Examined Patent Publication No. S61-21007 sets forth a self-oscillating class D amplifier including an integrator, a comparator, a switching circuit, a low-pass filter (LPF), a first feedback circuit, and a second feedback circuit. The integrator integrates an input audio signal. The comparator compares an output of the integrator with a feedback output from the first feedback circuit, to output a pulse width modulation signal (hereinafter, "PWM"). The switching circuit power-amplifies the PWM signal from the comparator, and then outputs the power-amplified PWM signal. The LPF removes carrier components from the PWM signal output from the switching circuit, to demodulate the power-amplified PWM signal. The first feedback circuit feeds back an output from the LPF to an inverting input terminal of the comparator. The second feedback circuit feeds back an output from the LPF to an inverting input terminal of the integrator. There is provided a loop circuit in which the output of the comparator is fed back to the input of the comparator through the LPF and the first feedback circuit. The loop circuit self-oscillates at frequency fo at which the phase delay in the loop circuit is 180 degrees. Changing the delay in the first feedback circuit enables the self-oscillating frequency fo to be adjusted. The feedback route of the second feedback circuit applies a negative feedback to the audio band including audible sounds such as music sounds or voice sounds, so that the gain of the amplifier in the audio band is determined.

In the foregoing conventional technique, the second feedback circuit negatively feeds back the output of the LPF to the input of the integrator, to achieve improvement of distortion characteristics and frequency characteristics. In amplifiers for audio signals, there is a desire for a further improvement of those characteristics by way of increasing negative feedback amount in a low frequency band (e.g., the audio band).

SUMMARY OF THE INVENTION

It is an object of the present invention to improve distortion characteristics and frequency characteristics by way of increasing negative feedback amount of a feedback from the output side to the input side in self-oscillating class D amplifiers.

To achieve the above-described object, a class D amplifier according to a preferred aspect of the present invention includes: a self-oscillating class D amplification circuit configured to be driven by inputting an output current signal; and a voltage-current converting circuit configured to receive a supply of a feedback signal from the self-oscillating class D amplification circuit and an input signal and to output the output current signal in response to a feedback signal voltage and an input signal voltage.

A class D amplifier according to another aspect of the present invention includes: a voltage-current converting circuit configured to output an output current signal in response to an input signal voltage; a comparator that includes a non-inverting input terminal that is grounded and an inverting input terminal that receives a supply of the output current signal, where the comparator is configured to compare a voltage on the non-inverting input terminal with a voltage on the inverting input terminal, to output a pulse width modulation signal; a switching circuit configured to power-amplify the pulse width modulation signal output from the comparator; a low-pass filter configured to generate an output signal from the power-amplified pulse width modulation signal; a first feedback circuit configured to feed back the output signal output from the low-pass filter, to the inverting input terminal of the comparator; and a second feedback circuit configured to feed back the output signal output from the low-pass filter, to the voltage-current converting circuit.

A class D amplifier according to another aspect of the present invention includes: a voltage-current converting circuit that includes a first terminal that receives a supply of a first input signal and a second terminal that receives a supply of a second input signal, where the voltage-current converting circuit is configured to output a first output current signal and a second output current signal in response to a differential voltage between the first terminal and the second terminal; a comparator that includes a third terminal that receives a supply of the first current signal and a fourth terminal that receives a supply of the second current signal, where the comparator is configured to compare a voltage on the third terminal with a voltage on the fourth terminal; a first switching circuit configured to power-amplify the pulse width modulation signal output from the comparator; a first low-pass filter configured to generate a first output signal from a signal power-amplified by the first switching circuit; an inverting circuit configured to invert the pulse width modulation signal from the comparator; a second switching circuit configured to power-amplify the inverted signal; a second low-pass filter configured to generate a second output signal from a signal power-amplified by the second switching circuit; a first feedback circuit configured to feed back the first output signal to the fourth terminal, and to feed back the second signal to the third terminal; and a second feedback circuit configured to feed back the first output signal to the first terminal, and to feed back the second signal to the second terminal.

DESCRIPTION OF THE EMBODIMENTS

Embodiments of the present invention will be described below with reference to the drawings.

First Embodiment

Figure 1:
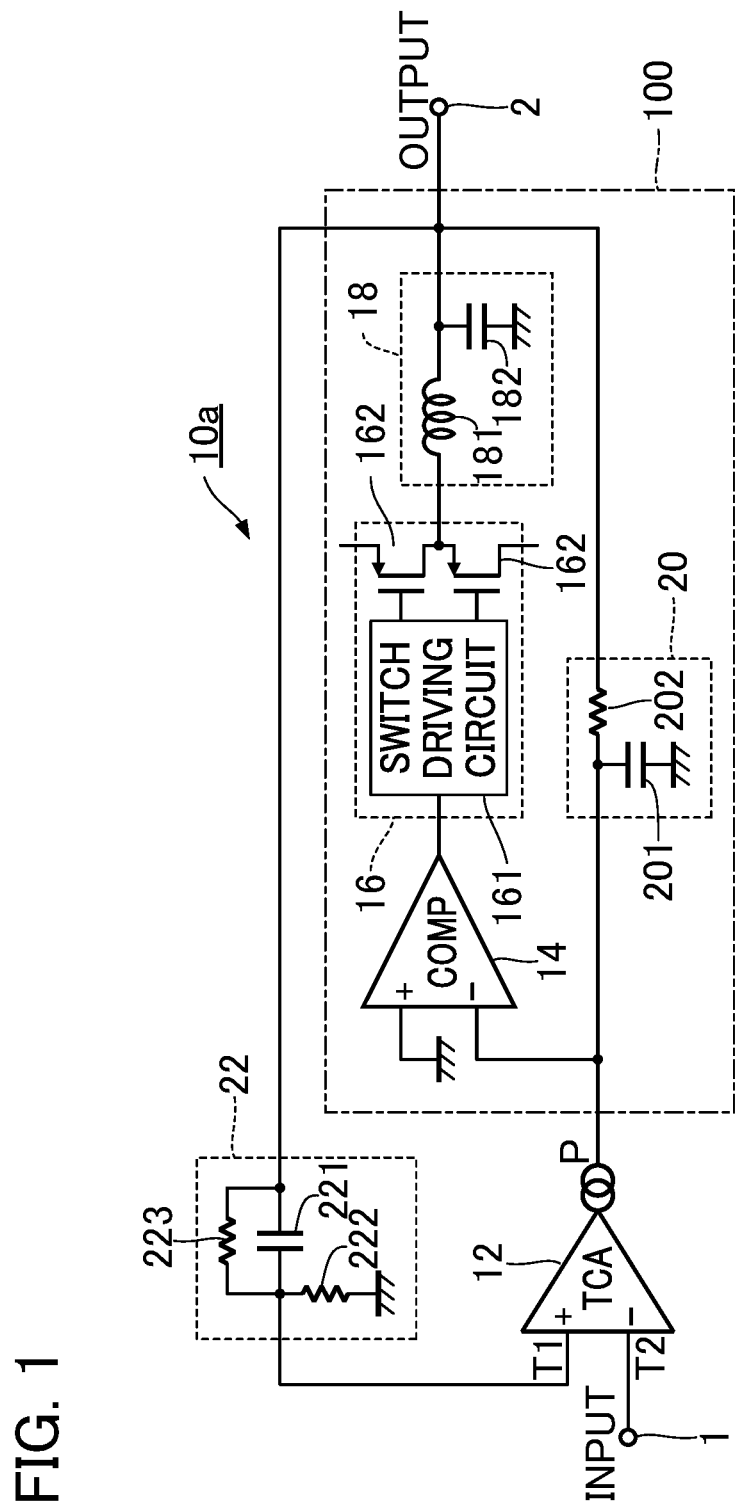
FIG. 1 is a circuit diagram of an amplifier according to a first embodiment of the present invention.

FIG. 1 illustrates a circuit diagram of an amplifier 10a according to a first embodiment of the present invention. The amplifier 10a is a self-oscillating D class amplifier that amplifies an audio signal supplied to an input 1 (e.g., an input terminal) by self-oscillating, to output the amplified audio signal from an output 2 (e.g., an output terminal). The audio signal is an analog signal representative of sound such as music sound, voice sound or the like. As exemplified in FIG. 1, the amplifier 10a includes a transformer conductance amplifier (hereinafter, "TCA") 12, a comparator (COMP) 14, a switching circuit 16, a low-pass filter (hereinafter, "LPF") 18, a first feedback circuit 20 and a second feedback circuit 22.

The TCA 12 has a non-inverting input terminal T1 (an example of a first terminal) and an inverting input terminal T2 (an example of the second terminal). The inverting input terminal T2 of the TCA 12 receives a supply of the audio signal input to the input 1. The non-inverting input terminal T1 of the TCA 12 receives a supply of a feedback signal from the following second feedback circuit 22. The TCA 12 is a voltage-current converting circuit that outputs an output current signal (in other words, an output current) from an output terminal P responsive to a differential voltage between the non-inverting input terminal T1 and the inverting input terminal T2. Specifically, the TCA 12 outputs the output current signal having its value proportional to the differential voltage between the non-inverting input terminal T1 and the inverting input terminal T2. Even if any load is connected to the output terminal P, the TCA 12 outputs the output current signal having its value responsive to an input voltage thereto. Therefore, the output terminal P has the output impedance that appears to be infinite. This output current signal has a reverse phase to the audio signal supplied to the input 1. The amplifying part in the downstream of the comparator 14 is driven by the output current signal from the output terminal P The comparator 14 modulates the audio signal supplied to the input 1 by pulse width modulation, to generate a pulse width modulation signal (hereinafter, "PWM"). Specifically, a non-inverting input terminal of the comparator 14 is grounded, and an inverting input terminal of the comparator 14 receives a supply of the output current signal from the TCA 12. The comparator 14 compares a voltage of a signal acquired by adding a feedback signal from the feedback circuit 20 to the output current signal from TCA 12, with the reference voltage, to generate the PWM signal and then outputs the generated PWM signal. The reference signal is, for example, the ground voltage. The comparator 14 includes an operational amplifier, which is the main element of the comparator 14, and has relatively high input impedance.

The switching circuit 16 includes a switch driving circuit 161, and two switches 162. The switching circuit 16 power-amplifies the PWM signal from the comparator 14, to output the power-amplified PWM signal.

Specifically, the two switches 162 are controlled in response to the PWM signal in such a way that any one of the switches 162 is turned to be in the on state. The LPF 18 includes an inductor 181 and a capacitor 182. The LPF 18 removes carrier components (that is, the frequency components of the self-oscillation) from the power-amplified PWM signal, to demodulate the power-amplified PWM signal. The modulated audio signal is output from the output 2 of the amplifier 10a.

The first feedback circuit 20 delays the phase of the audio signal output to the output 2, and then feeds back the audio signal to the inverting input terminal of the comparator 14. This feedback enables the amplifier 10a to self-oscillate, to serve as a self-oscillating class D amplifier. As in the conventional technology, the oscillation frequency fo of the amplifier 10a is controlled by the amount of the delay in the first feedback circuit 20. As a whole, the self-oscillating class D amplifier 100, which is an inverting type, is configured by a loop circuit in which the output of the comparator 14 is fed back to the input of the comparator 14 through the LPF 18 by the first feedback circuit 20. In other words, the self-oscillating class D amplifier 100 includes the comparator 14, the switching circuit 16, the LPF 18 and the first feedback circuit 20. As mentioned above, the phase of the output current signal from the TCA 12 is a reverse phase to the audio signal supplied to the input 1. Therefore, the whole amplifier 10a functions as a non-inverting type amplifier that outputs from the output 2 an output signal having the same phase as the audio signal supplied to the input 1.

The feedback signal from the first feedback circuit 20 is fed back to the comparator 14. As mentioned above, the TCA 12 has the output impedance that appears to be infinite. Therefore, all of the fed back signal from the first feedback circuit 20 is fed back to the comparator 14; that is, the feedback amount of the feedback to the comparator 14 is 100%. Thus, increasing the feedback amount improves distortion characteristics and frequency characteristics in the audio band of the amplifier 10a.

The second feedback circuit 22 is a differential circuit including a capacitor 221, a resistor 222 and a resistor 223. The second feedback circuit 22 corrects the phase of the audio signal output to the output 2, and feeds back the corrected audio signal to the non-inverting input terminal T1 of the TCA 12. The phase of the audio signal is adjusted, by the second feedback circuit 22, in response to the capacitance of the capacitor 221, the resistance of the resistor 222, and the resistance of the resistor 223.

As illustrated in the circuit of FIG. 1, the non-inverting input terminal of the comparator 14 is grounded. Furthermore, the voltage of the inverting input terminal of the comparator 14 does not swing so much around the reference voltage. Therefore, the comparator 14 is not required to have a relatively high breakdown voltage (±30 V or more). Accordingly, an ordinary semiconductor device having a relatively low breakdown voltage (±2V to 20V or more) can be used as the comparator 14.

Figure 2:
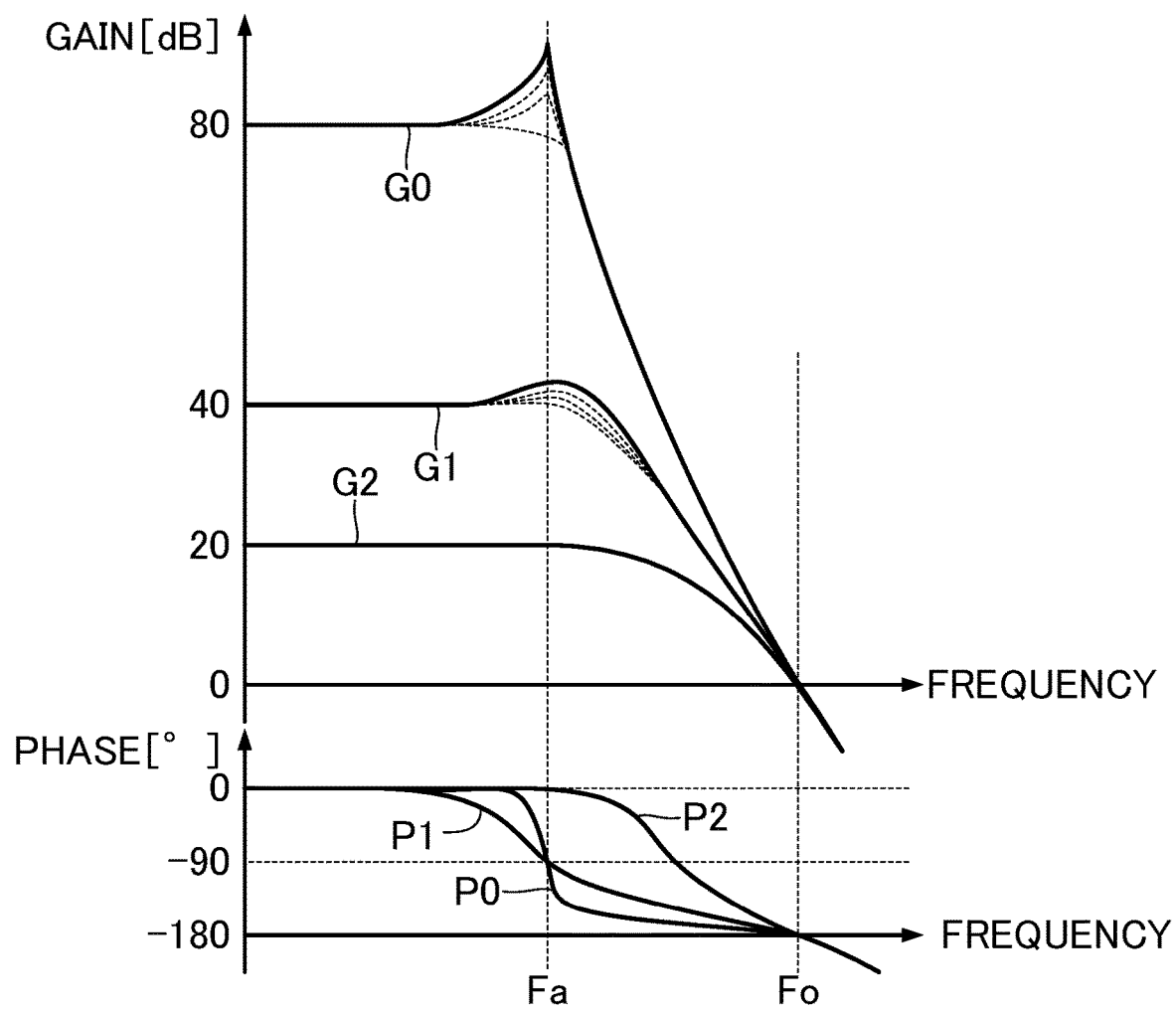
FIG. 2 shows Bode plots illustrating characteristics of an amplifier.

FIG. 2 shows Bode plots illustrating frequency characteristics of the amplifier 10a. Examples of the frequency characteristics include gain characteristics G0, G1 and G2, and phase characteristics P0, P1 and P2. The gain characteristic G0 and the phase characteristic P0 each illustrated in FIG. 2 is a frequency characteristic of the inverting self-oscillating class D amplifier 100 in a case in which no first feedback circuit 20 is provided in the inverting self-oscillating class D amplifier 100. The gain characteristic G0 takes relatively high value locally around frequency Fa due to the effects of the resonance of the LPF 18. Furthermore, the phase characteristic P0 changes sharply from 0 degrees to −180 degrees around the frequency Fa.

The gain characteristic G1 and the phase characteristic P1 each illustrated in FIG. 2 indicate a frequency characteristic in a case in which the self-oscillating class D amplifier 100 alone is used (and in a case in which the first feedback circuit 20 is provided). As will be understood from FIG. 2, in the self-oscillating class D amplifier 100 alone, the gain characteristic G1 is generally flat around the frequency Fa by control of the resonance. However, a local change in gain is not completely removed. The phase characteristic P1 gently changes as compared with the phase characteristic P0. The frequency Fa takes an appropriate value within the range of, for example, 30 kHz to 100 kHz inclusive.

Adding the self-oscillating class D amplifier 100 and the TCA 12 to the second feedback circuit 22 realizes the gain characteristic G2 and the frequency characteristics P2 illustrated in FIG. 2 in the amplifier 10a as a whole. In other words, the second feedback circuit 22 and the TCA 12 determine characteristics (e.g., amplification factor) of the entire amplifier 10a. It is of note that self-oscillating frequency Fo takes an appropriate value within the range of, for example, 200 kHz to 1 MHz inclusive.

As will be understood from the gain characteristic G2 and the phase characteristic P2, since the second feedback circuit 22 and the TCA 12 are provided in the first embodiment, changes in gain and phase are suppressed over the wide frequency range (especially, the audio band), which is less than or equal to the frequency Fa, as compared with a configuration in which the inverting self-oscillating class D amplifier 100 alone is provided (see the gain characteristic G1 and the phase characteristic P1 illustrated in FIG. 2). As a result, gain characteristics and phase characteristics are made uniform. In other words, as mentioned above, in the first embodiment, acquiring the feedback amount by the TCA 12 enables distortion characteristics and frequency characteristics in the audio band in the amplifier 10a to be improved.

In FIG. 2, as illustrated by broken lines together with lines of the gain characteristics G0 and G1, in a case in which the self-oscillating class D amplifier 100 alone is provided, the gain characteristic G0 and the gain characteristic G1 changes in response to the impedance of a load (e.g., a speaker) connected to the output 2. Conversely, as illustrated in FIG. 2, the amplifier 10a including the second feedback circuit 22 and the TCA 12 as a whole provides an advantage that a change in the gain characteristic G2, due to the load impedance, is reduced.

Second Embodiment

A second embodiment of the present invention will be described. In the embodiments shown below, elements having the same actions and functions as in the first embodiment are denoted by the same respective reference numerals as used for like elements in the description of the first embodiment, and detailed description thereof is omitted where appropriate.

Figure 3:
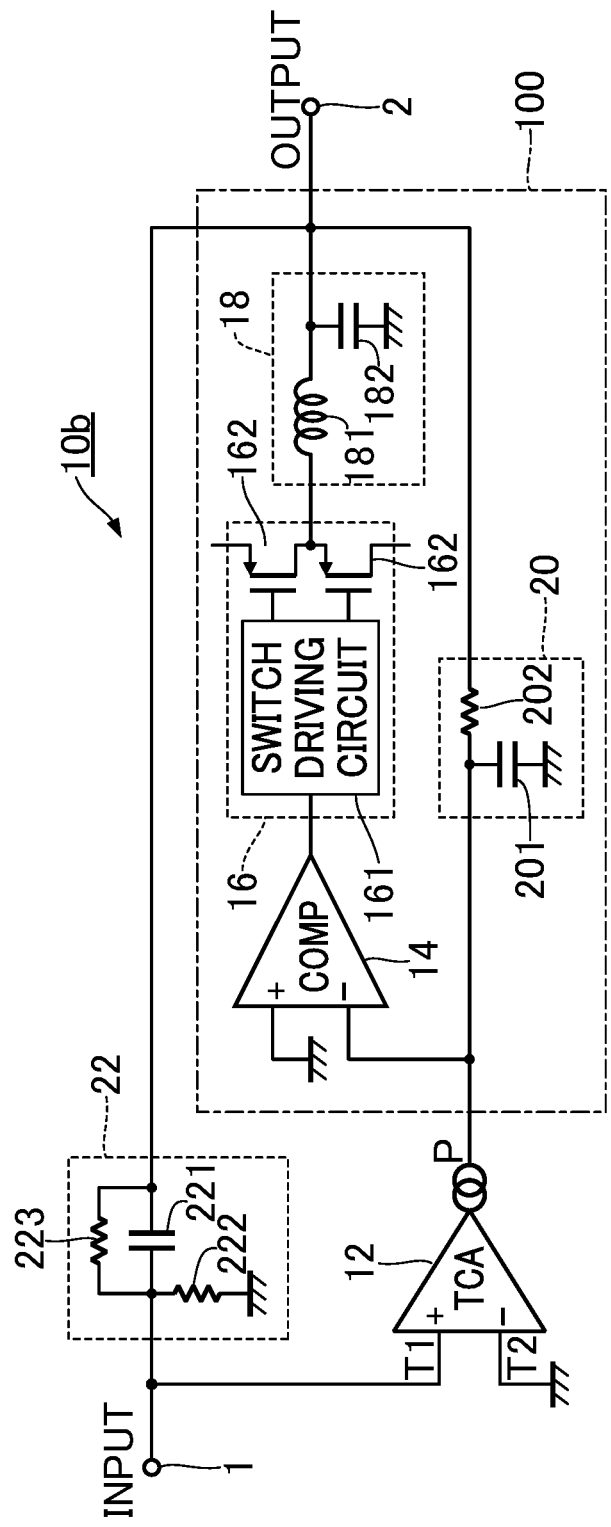
FIG. 3 is a circuit diagram of an amplifier according to a second embodiment of the present invention.

FIG. 3 is a circuit diagram of an amplifier 10b according to the second embodiment. In the first embodiment, the amplifier 10a, which is a non-inverting type, is exemplified. As exemplified in FIG. 3, the amplifier 10b in the second embodiment is a non-inverting type amplifier that inverts the audio signal supplied to the output 1, and then outputs the inverted audio signal as an output signal from output 2. In the amplifier 10b, the configuration of the self-oscillating class D amplifier 100 is the same as that of the first embodiment. The configuration of the second feedback circuit 22 is also the same as that of the first embodiment.

As exemplified in FIG. 3, the audio signal supplied to the output 1 and the second feedback signal from the second feedback circuit 22 are supplied to the non-inverting input terminal T1 of the TCA 12. The inverting input terminal T2 of the TCA 12 is grounded. The output current signal output from TCA 12 has the same phase as the audio signal supplied to the input 1. Similarly in the first embodiment, the inverting self-oscillating class D amplifier 100 is an inverting type amplifier. Therefore, the entire amplifier 10b functions as an inverting type amplifier that inverts an audio signal supplied to the input 1 and then outputs the inversed audio signal from the output 2. The second embodiment realizes the same effect of the first embodiment.

Third Embodiment

Figure 4:
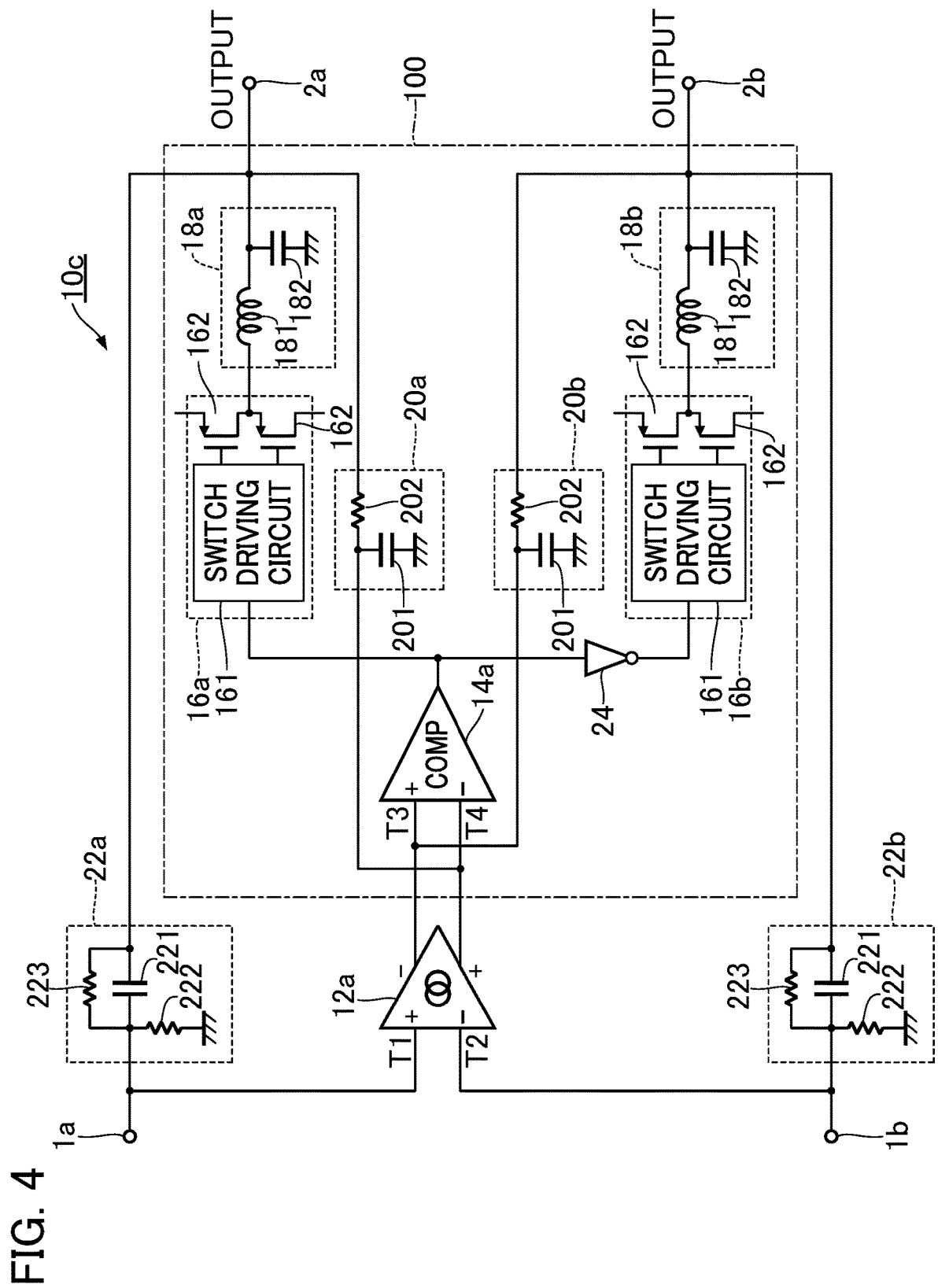
FIG. 4 is a circuit diagram of an amplifier according to a third embodiment of the present invention.

FIG. 4 is a circuit diagram of an amplifier 10c according to a third embodiment. As exemplified in FIG. 4, the amplifier 10c in the third embodiment is a fully-balanced type amplifier. The amplifier 10c includes a TCA 12a, a comparator 14a, a switching circuit 16a, a switching circuit 16b, an LPF 18a, an LPF 18b, a feedback unit 20a, a feedback unit 20b, a feedback unit 22a, a feedback unit 22b, and an inventor 24.

A first input signal and a second input signal, which form a pair of differential audio signals, are supplied to an input 1a and an input 1b, respectively. Specifically, the first input signal, which is a positive signal, is supplied to the input 1a (an example of "first input terminal"). The second input signal, which is a negative signal, is supplied to the second input 1b (an example of "second input terminal"). The first input signal and the second input signal are amplified by the amplifier 10c. Then the amplified first input signal is output, as a first output signal, from an output 2a. The amplified second input signal is output, as a second output signal, from an output 2b. The first output signal and the second output signal also form a pair of differential audio signals. Specifically, the first output signal, which is a negative signal, is output from the output 2a. The second output signal, which is a positive signal, is output from the input 2b.

The TCA 12a is a differential type voltage-current converting circuit. The TCA 12a includes a non-inverting input terminal T1 (an example of "first terminal"), an inverting input terminal T2 (an example of "second terminal"), an inverting output terminal (−) and a non-inverting output terminal (+). The non-inverting input terminal T1 receives a supply of the first input signal from the input 1a. The inverting input terminal T2 receives a supply of the second input signal from the input 1b. The TCA 12a outputs a first current signal and a second current signal, both of which are responsive to a differential voltage between the non-inverting input terminal T1 and the inverting input terminal T2. Specifically, the first current signal, which is a negative current signal, is output to the inverting output terminal of the TCA 12a. A second current signal, which is a positive current signal, is output to the non-inverting output terminal of the TCA 12a. The inverting output and the non-inverting output have the output impedances that appear to be infinite.

The comparator 14a modulates the audio signals supplied to the inputs 1a and 1b by pulse width modulation, to generate a pulse width modulation signal. Specifically, the comparator 14a includes a non-inverting input terminal T3 (an example of "third terminal") and an inverting input terminal T4 (an example of "fourth terminal"). The non-inverting input terminal T3 receives a supply of the first current signal from the inverting output terminal of the TCA 12a. The inverting input terminal T4 receives a supply of the second current signal from the non-inverting output terminal of the TCA 12a. The comparator 14a compares a voltage on the non-inverting input terminal T3 with a voltage on the inverting input terminal T4, to output the PWM signal.

Each of configurations of the switching circuits 16a and 16b is the same as that of the switching circuit 16 in the first embodiment. Each of configurations of the LPFs 18a and 18b is the same as that of the LPF 18 in the first embodiment. Furthermore, each of configurations of the feedback units 20a and 20b is the same as that of the first feedback circuit 20 in the first embodiment. Each of configurations of the feedback units 22a and 22b is the same as that of the second feedback circuit 22 in the first embodiment.

The PWM signal output from the comparator 14a is supplied to the switching circuit 16a and the invertor 24. The invertor 24 inverts the level of the PWM signal output from the comparator 14a. The PWM signal inverted by the invertor 24 is supplied to the switching circuit 16b.

The switching circuit 16a (an example of "first switching circuit") power-amplifies the PWM signal supplied from the comparator 14a, and then outputs the power-amplified PWM signal. The LPF 18a (an example of "first low-pass filter") removes carrier components from the power-amplified PWM signal, to output the first output signal. The first output signal from the LPF 18a is output from the output 2a. The feedback unit 20a delays the phase of the first output signal output to the output 2a, and then feeds back the first output signal to the inverting input terminal T4 of the comparator 14a. The feedback unit 22a corrects the phase of the first output signal output to the output 2a, and then feeds back the corrected first output signal to the non-inverting input terminal T1 of the TCA 12a.

The switching circuit 16b (an example of "second switching circuit") power-amplifies the PWM signal supplied from the invertor 24, and then outputs the power-amplified PWM signal. The LPF 18b (an example of "second low-pass filter") removes carrier components from the power-amplified PWM signal, to output the second output signal. The second output signal from the LPF 18b is output from the output 2b. The feedback unit 20b delays the phase of the second output signal output to the output 2b, and then feeds back the second output signal to the non-inverting input terminal T3 of the comparator 14a. The feedback unit 22b corrects the phase of the second output signal output to the output 2b, and then feeds back the corrected second output signal to the inverting input terminal T2 of the TCA 12a.

As described above, the feedback units 20a and 20b function as a first feedback circuit that feeds back the first output signal supplied to the output 2a to the inverting input terminal T4 of the comparator 14a, and feeds back the second output signal supplied to the output 2b to the non-inverting input terminal T3 of the comparator 14a. A self-oscillating class D amplifier is configured by a loop circuit in which the output of the comparator 14a is fed back to the input of the comparator 14a through the switching circuit 16a, the LPF 18a and the feedback unit 20a. Similarly, the other self-oscillating class D amplifier is configured by a loop circuit in which the output of the comparator 14a is fed back to the comparator 14a through the invertor 24, the switching circuit 16b, LPF 18b and the second feedback unit 20b. Furthermore, the feedback units 22a and 22b function as a second feedback circuit that feeds back the first output signal supplied to the output 2a to the non-inverting input terminal T1 of the TCA 12a, and feeds back the second output signal supplied to the output 2b to the inverting input terminal T2 of the TCA 12a.

The third embodiment realizes the same effects as the first embodiment. Furthermore, the third embodiment provides an advantage that the amplifier 10c is unlikely to be affected by fluctuation of a power supply voltage and/or generation of noise because of amplification of a pair of differential audio signals.

In each of embodiments described above, the amplifying part in the downstream of the comparator 14 is used as the inverting self-oscillating class D amplifier 100, which is an inverting type. However, the amplifying part may not be the inverting type. Driving the self-oscillating class D amplifier 100 by output currents converted by the TCA 12a improves distortion characteristics and frequency characteristics in the audio band.

Furthermore, the specific circuit configurations in the each of the foregoing embodiments are not limited to those described above, and they may be modified and implemented as necessary. For example, configurations of the first feedback circuit 20 and the second feedback circuit 22 or the like are not limited to those illustrated in the foregoing drawings.

The following configuration are derivable from the foregoing exemplary embodiments, for example.

A class D amplifier according to preferred aspect (hereinafter "aspect 1") includes: a self-oscillating class D amplification circuit configured to be driven by inputting an output current signal; and a voltage-current converting circuit configured to receive a supply of a feedback signal from the self-oscillating class D amplification circuit and an input signal and to output the output current signal in response to a feedback signal voltage and an input signal voltage.

In this aspect, distortion characteristics and frequency characteristics are improved by way of increasing the amount of a negative feedback from the output side to the input side.

In a preferred example (hereinafter "aspect 2") according to the aspect 1, the voltage-current converting circuit includes: a first terminal configured to receive a supply of the feedback signal from the self-oscillating class D amplification circuit, and a second terminal configured to receive a supply of the input signal, and in which the output current signal is a signal responsive to a differential voltage between the first terminal and the second terminal.

In a preferred example (hereinafter "aspect 3") according to the aspect 1, the voltage-current converting circuit includes: a first terminal configured to receive a supply of the input signal and the feedback signal from the self-oscillating class D amplification circuit, and a second terminal that is grounded, and in which the output current signal is a signal responsive to a differential voltage between the first terminal and the second terminal.

A class D amplifier according to preferred aspect (hereinafter "aspect 4") includes: a voltage-current converting circuit configured to output an output current signal in response to an input signal voltage; a comparator that includes a non-inverting input terminal that is grounded and an inverting input terminal that receives a supply of the output current signal, where the comparator is configured to compare a voltage on the non-inverting input terminal with a voltage on the inverting input terminal, to output a pulse width modulation signal; a switching circuit configured to power-amplify the pulse width modulation signal output from the comparator; a low-pass filter configured to generate an output signal from the power-amplified pulse width modulation signal; a first feedback circuit configured to feed back the output signal output from the low-pass filter, to the inverting input terminal of the comparator; and a second feedback circuit configured to feed back the output signal output from the low-pass filter, to the voltage-current converting circuit.

In this aspect, distortion characteristics and frequency characteristics are improved by way of increasing the amount of a negative feedback from the output side to the input side.

A class D amplifier according to preferred aspect (hereinafter "aspect 5") includes: a voltage-current converting circuit that includes a first terminal that receives a supply of a first input signal and a second terminal that receives a supply of a second input signal, where the voltage-current converting circuit is configured to output a first output current signal and a second output current signal in response to a differential voltage between the first terminal and the second terminal; a comparator that includes a third terminal that receives a supply of the first current signal and a fourth terminal that receives a supply of the second current signal, where the comparator is configured to compare a voltage on the third terminal with a voltage on the fourth terminal; a first switching circuit configured to power-amplify the pulse width modulation signal output from the comparator; a first low-pass filter configured to generate a first output signal from a signal power-amplified by the first switching circuit; an inverting circuit configured to invert the pulse width modulation signal from the comparator; a second switching circuit configured to power-amplify the inverted signal; a second low-pass filter configured to generate a second output signal from a signal power-amplified by the second switching circuit; a first feedback circuit configured to feed back the first output signal to the fourth terminal, and to feed back the second signal to the third terminal; and a second feedback circuit configured to feed back the first output signal to the first terminal, and to feed back the second signal to the second terminal.

In this aspect, distortion characteristics and frequency characteristics are improved by way of the amount of a negative feedback from the output side to the input side.

DESCRIPTION OF REFERENCE SIGNS 1, 1a, 1b . . . input
2, 2a, 2b . . . output
10 . . . amplifier
100 . . . inverting self-oscillating class D amplifier
12, 12a . . . transformer conductance amplifier (TCA)
14, 14a . . . comparator
16, 16a, 16b . . . switching circuit
18, 18a, 18b . . . LPF
20 . . . first feedback circuit
20a, 20b . . . feedback unit
22 . . . second feedback circuit
22a, 22b . . . feedback unit

What is claimed is:

1. A class D amplifier comprising:
a self-oscillating class D amplification circuit configured to be driven by inputting an output current signal, wherein the self-oscillating class D amplification circuit comprises:
a comparator that includes a non-inverting input terminal that is grounded and an inverting input terminal that receives a supply of the output current signal, where the comparator is configured to compare a voltage on the non-inverting input terminal with a voltage on the inverting input terminal, to output a pulse width modulation signal;
a switching circuit configured to power-amplify the pulse width modulation signal output from the comparator;
a low-pass filter configured to generate an output signal from the power-amplified pulse width modulation signal; and
a first feedback circuit configured to feed back the output signal output from the low-pass filter, to the inverting input terminal of the comparator;
a second feedback circuit configured to receive an audio signal from the self-oscillating class D amplification circuit, adjust a phase of the audio signal, and output the adjusted audio signal as a feedback signal; and
a voltage-current converting circuit configured to receive a supply of the feedback signal from the second feedback circuit and a supply of an input signal, and to output the output current signal in response to a feedback signal voltage and an input signal voltage.

2. The class D amplifier according to claim 1, wherein the voltage-current converting circuit includes:
a first terminal configured to receive the supply of the feedback signal from the second feedback circuit; and
a second terminal configured to receive the supply of the input signal,
wherein the output current signal is a signal responsive to a differential voltage between the first terminal and the second terminal.

3. The class D amplifier according to claim 1, wherein the voltage-current converting circuit includes:
a first terminal configured to receive a supply of the input signal and the feedback signal from the self-oscillating class D amplification circuit; and
a second terminal that is grounded, and
wherein the output current signal is a signal responsive to a differential voltage between the first terminal and the second terminal.

* * * * *